United States Patent [19]
Yoshikawa et al.

[11] Patent Number: 5,986,930
[45] Date of Patent: Nov. 16, 1999

[54] NON-VOLATILE SEMICONDUCTOR MEMORY DEVICE

[75] Inventors: Sadao Yoshikawa, Yoro-gun; Shigenori Shibata, Anpachi-gun, both of Japan

[73] Assignee: Sanyo Electric Co., Ltd., Osaka, Japan

[21] Appl. No.: 09/119,826

[22] Filed: Jul. 21, 1998

[30] Foreign Application Priority Data

| Jul. 22, 1997 | [JP] | Japan | 9-196139 |
| Feb. 19, 1998 | [JP] | Japan | 10-037345 |
| Feb. 19, 1998 | [JP] | Japan | 10-037346 |

[51] Int. Cl.$^6$ .................................................. G11C 16/04
[52] U.S. Cl. ............................... 365/185.03; 365/185.18; 365/185.21
[58] Field of Search .................. 365/185.03, 185.18, 365/185.21, 185.29, 218

[56] References Cited

U.S. PATENT DOCUMENTS 5,818,759  10/1998  Kobayashi ......................... 365/185.18
5,889,699   3/1999  Takano ............................... 365/185.18

OTHER PUBLICATIONS

Bauer, et al. "A Multilevel–Cell 32Mb Flash Memory," 1995 IEEE International Solid–State Circuits Conference, Session 7, Paper TA 7.7, pp. 132–133. ISBN 0–7803–2495–1/95.

*Primary Examiner*—Trong Q. Phan
*Attorney, Agent, or Firm*—Loeb & Loeb LLP

[57] ABSTRACT

A word line is connected to a control gate of memory cell transistor, and a bit line and a source line are connected to a drain and a source of the memory cell transistor, respectively. A write clock having a certain crest value is applied to the source line, and an earth potential or a power supply potential is applied to the bit line in response to a read clock having a phase which is opposite to that of the write clock. A row selection clock which synchronizes with the write clock and a crest value of which is de-escalated is applied to the word line.

8 Claims, 11 Drawing Sheets

NON-VOLATILE SEMICONDUCTOR MEMORY DEVICE

BACKGROUND OF THE INVENTION

1. Field of the Invention

The present invention relates to a non-volatile semiconductor memory device which enables storing analog information and multiple-valued information using memory cell transistors having floating gates.

2. Description of the Related Art

In an electrically erasable programmable ROM (EEPROM) in which a memory cell is composed of a single transistor, each memory cell is formed by a double gate transistor having a floating gate and a control gate. In such a double gate memory cell transistor, data are written to the memory cell transistor by accelerating and injecting hot electrons generated on the drain region side of the floating gate. On the other hand, data are read out from the memory cell transistor by detecting a difference in performance characteristics of the memory cell transistor which may arise depending on whether or not electric charges are injected into the floating gate.

FIG. 1 is a top view of the memory cell portion of a nonvolatile semiconductor memory device having floating gates, and FIG. 2 is a sectional view along its X—X line. These drawings show split gate structure in which a part of a control gate is arranged side by side with a floating gate.

On the surface area of a P-type silicon substrate 1, a plurality of isolated regions 2 composed of oxide film (LOCOS), which is thickly formed in selective, are formed in rectangular pattern, and element regions are marked off by the oxide film (LOCOS). On the oxide film 3 formed on the silicon substrate 1, a plurality of floating gates 4 are arranged such that each of these gates stretches over two neighboring isolated regions 2. The floating gates 4 are independently arranged at every memory cell. Further, oxide film 3a is thickly formed on the central part of each of the floating gates 4, thereby causing the edge of the respective floating gates 4 to form an acute angle. This facilitates electric field enhancement at the edge of the respective floating gates 4 when data is erased. On the silicon substrate 1 where a plurality of floating gates 4 are arranged, control gates 5 are arranged in such a manner that each control gate 5 corresponds to the floating gate 4 in every row. These control gates 5 are arranged in such a manner that a portion of each control gate 5 lies on the oxide film 3a and faces the corresponding floating gates 4 and the remaining part lies upon the oxide film 3 and faces the silicon substrate 1. These floating gates 4 and control gates 5 are arranged in such a manner that the respective neighboring rows have a plane symmetry with each other. In a substrate region between neighboring control gates 5 and a substrate region between neighboring floating gates 4, N-type first diffusion layers 6d and second diffusion layers 6s are formed. Each of the first diffusion layers 6d is surrounded by the isolated region 2 between neighboring control gates 5 and is thereby independent. The second diffusion layers 6s are arranged between neighboring floating gates 4 successively in a direction which the control gates 5 are extended. A memory cell transistor is composed of one floating gate 4, one control gate 5, one first diffusion layer 6d, and one second diffusion layer 6s. Here, the first diffusion layer 6d becomes a drain, whereas the second diffusion layer 6s becomes a source. On the oxide film 7 formed on each control gate 5, aluminum wiring 8 is arranged in a direction which the aluminum wiring 8 intersects the control gates 5. The aluminum wiring 8 is connected to the first diffusion layers 6d through contact holes 9.

For a memory cell transistor having such double gate structure, an ON-state resistance value between the source and the drain fluctuates with the amount of electric charge injected into the floating gate 4. Thus, by selectively injecting into the floating gate 4 an amount of electric charge which is in proportion to memory information, an ON-state resistance value of specified memory cell transistor may be varied in multiple stages.

FIG. 3 is a circuit diagram of the memory cells portion shown in FIG. 1. This diagram shows memory cells arranged in four rows of four.

In memory cell transistors 11 having a double gate structure, the control gates 5 arranged in the same row are connected to one of the word lines 12, and the first diffusion layers 6d (drains) arranged in the same column are connected to one of the bit lines 13 while the second diffusion layers 6s (sources) are connected to source line 14. The respective bit lines 13 are connected to a data line 16 via selection transistors 15 and also connected to a sense amplifier (not shown in drawings) to read out a voltage value.

The source line 14 to which each row of the memory cell transistors 11 is connected in common provides a write clock having a regular cycle $\phi W$ to each of the memory cell transistors 11. Further, the data line 16, which is selectively connected to each of the bit lines 13 via each of the selection transistors 15, selectively provides a read clock $\phi R$ to each of the memory cell transistors 11. In the case of an ordinary device, the respective control gates 5 which are formed at the same row of the memory cell transistors 11 in common are used as word lines 12, whereas the aluminum wirings 8 to be connected with the first diffusion layers 6d are used as bit lines 13. Further, the second diffusion layers 6s extended in parallel with the control gates 5 are used as source lines 14.

Row selection signals LS1 to LS4 are generated based on row address information. By selecting one of the word lines 12, a specified row of the memory cell transistors 11 is activated. Column selection signals CS1 to CS4 are generated based on column address information. By turning on one of the selection transistors 15, a specified column of the memory cell transistors 11 is activated. Thus, one of the plurality of memory cell transistors 11 to be arranged in a queue is designated based on the row address and column address information, and connected to the data line 16.

When data are written into one of the memory cell transistors 11, an earth potential (for example, 0V) is applied from one of the bit lines to the memory cell transistor 11, and a write potential (for example, 14V) is applied thereto from the source line 14. Thus, data are written into a specified memory cell transistor 11 which is selected in response to the row selection signals LS1 to LS4 and the column selection signals CS1 to CS4. In other word, electric charges are injected into the floating gate 4 of a specified memory cell. Further, when the data written into the memory cell transistor 11 are read out, a read potential (for example, 5V) is applied from one of the bit lines 13 and an earth potential (for example, 0V) is applied from the source line 14 to the memory cell transistor 11, respectively. Current then flows through the selected memory cell transistor 11 and a potential of the bit lines 13 fluctuates according to an ON-state resistance value of the memory cell transistor 11. The potential of the bit line at this time can be read out by the sense amplifier.

When analog information is written into the memory cell transistor 11, injection of electric charges (writing of data) and confirmation of the amount of the injection (reading of data) are repeated at a short interval in order to enhance recording accuracy. More specifically, while data are written into the memory cell transistor 11 little by little, all data are read out each time. When contents of the data to be stored coincides with the result of reading out, writing is terminated. For example, as shown in FIG. 4, write clock φW and read clock φR are set in reverse phase to each other, and either a write potential and a read potential or an earth potential are alternately applied to the bit lines 13 selected and source line 14 at regular intervals. Thus, the write clock φW is raised and a write potential is applied to the source line 14, whereby a period of applying an earth potential to the bit line 13 becomes a writing period W. Further, the read clock φR is raised and a read potential is applied to the selected bit lines 13, whereby a period of applying an earth potential to the source line 14 becomes a reading period R. When the result of reading out reaches a desired potential corresponding to memory information in reading operation, the write clock φW is terminated and writing operation completes.

FIG. 5 is a block diagram showing the constitution of a sense amplifier to detect an ON-state resistance value of the memory cell transistor 11 which is connected to the bit line 13.

The sense amplifier is composed of a pair of load resistances 21 and 22, a pair of current amplifiers 23 and 24, a reference transistor 25, a controlled potential generating circuit 26, a differential amplifier 27, and a determination control circuit 28. The pair of load resistances 21 and 22 have the same resistance value and are connected to a power source. The pair of current amplifiers 23 and 24 are composed of transistors and inverters, and are connected to the pair of load resistances 21 and 22 connected to the power source. The bit line 13 to be connected to the memory cell transistor 11 is connected to the current amplifier 23 on one side, whereas the reference transistor 25 is connected to the current amplifier 24 on the other side. The reference transistor 25 is connected between the current amplifier 24 and an earth point, and varies a resistance value in response to a reference potential VRG which is applied to a gate of the reference transistor 25. The controlled potential generating circuit 26 generates the reference potential VRG which is corresponding to multiple-valued information to be stored in the memory cell transistor 11, and then provides the reference potential VRG to a gate of the reference transistor 25. For example, when the memory cell transistor 11 stores information of four values (two-bit portions), three kinds of gate potentials VRG are successively generated so as to vary the resistance value of the reference transistor 25 in three stages.

Two inputs of the differential amplifier 27 are connected to contact points with both the pair of load resistances 21 and 22 and the pair of current amplifiers 23 and 24. The differential amplifier 27 compares potentials VBL and VRL of each contact point, and provides a comparison output CO to a determination control circuit 28. The determination control circuit 28 controls generation of the reference potential VRG by the controlled potential generating circuit 26. It also discriminates the comparison output CO provided from the differential amplifier 27 and generates data D1 and D2 of multiple bits corresponding to multiple-valued information. For example, when information of four values is discriminated, the intermediate reference potential among three levels of reference potentials is first generated in order to determine a superior bit, and then either of higher and lower potentials among the three levels of reference potentials is generated according to the result of determination of the superior bit in order to determine an inferior bit.

When data are read out from the memory cell transistor 11, as the source of the memory cell transistor 11 is grounded, the load resistance 21 and the memory cell transistor 11 are connected in series between a power supply and an earth via the current amplifier 23. Similarly, the load resistance 22 and the reference transistor 25 are connected in series between a power supply and an earth via the current amplifier 24. A potential VBL at the contact point of the load resistance 21 and the current amplifier 23 is determined based on a ratio of the load resistance 21 to the memory cell transistor 11 in driving force. Similarly, a potential VRL at the contact point of the load resistance 22 and the current amplifier 24 is determined based on a ratio of the load resistance 22 to the reference transistor 25 in driving force. Therefore, based on the comparison output CO from the differential amplifier 27, it is possible to determine a range in which a resistance value of the memory cell transistor 11 is, as compared with the reference transistor 25 whose resistance value is varied in stages. Such a sense amplifier is, for example, disclosed in 1995 IEEE/International Solid-State Circuit Conference/Session 7/Flash Memory/Paper TA 7.7.

In the case of a split gate type memory cell transistor 11, whenever writing is performed by the write clock φW (electric charges are injected into the floating gate), an ON-state resistance value becomes high. Therefore, at the time of reading operation which is alternately repeated with writing operation, a potential VBL of the bit line 13 varies in stages from an earth potential to a power supply potential as the writing operation is repeated, as shown in FIG. 6. A variation of the potential VBL at the bit line 13 resulting from the writing operation performed once is large in the beginning of the writing operation, but gradually becomes small with the progress of the writing operation. Further, when it finally reaches the power supply potential VDD, the potential VBL at the bit line 13 no longer varies.

When the memory cell transistor 11 is made to store multiple-valued information, a range between the earth potential and the power supply potential is equably divided by the number of steps of memory information, and the number of writing operations is controlled in order that the bit line potential VBL at the time of a reading operation corresponds to one of the divided potentials to be written. For example, as described above, when the memory cell transistor 11 is made to store information of four values, for the purpose of enabling reading out two kinds of intermediate values, the number of writing operations is controlled so that the bit line potential VBL coincides with either of the potentials VDD/3 or 2VDD/3 which are two parts of a trisection of the power supply potential VDD (the earth potential is 0V). However, if an amount of electric charges in writing operation at a time is large, in other words, if a rate of change of the bit line potential VBL is large (a sharp rise of the curved line shown in FIG. 6), it will be difficult to accurately control the bit line potential VBL and therefore there will be a large error in the values between a desired potential to be written and a bit line potential VBL to be read out. Consequently, resolution of the memory cell transistor 11 is deteriorated, thereby making it difficult to achieve a multiplicity of values of memory information.

SUMMARY OF THE INVENTION

The object of the present invention is to enable accurate control of a potential to be written into a memory cell transistor.

The present invention is made in order to solve the problems mentioned above. In one aspect, the present invention comprises a memory cell transistor, having a floating gate insulated from other portion and a control gate at least one part of which overlaps with the floating gate, for varying an ON-state resistance value according to an amount of electric charge accumulated at the floating gate; a word line to be connected with the control gate of the memory cell transistor; a source line to be connected to a source of the memory cell transistor; a bit line to be connected to a drain of the memory cell transistor; a first control circuit for activating the memory cell transistor by applying a predetermined potential to the word line; and a second control circuit for providing a first amount of current from the source line to the bit line through the memory cell transistor when the memory cell transistor is activated, wherein the first control circuit de-escalates a potential to be provided to the word line with the progress of writing of data into the memory cell transistor.

In a second aspect, the present invention comprises a first control circuit for activating a memory cell transistor by periodically applying a prescribed potential to a word line in response to a clock having a regular cycle; and a second control circuit for providing a first amount of current from a source line to a bit line through the memory cell transistor, wherein the first control circuit comprises a counter for counting the clock and a decoder for generating a potential which varies according to a count value of the counter, and de-escalates a potential to be provided to the word line according to the count value of the counter.

A third aspect of the present invention comprises a first control circuit for activating a memory cell transistor by applying a predetermined potential to a word line; a second control circuit for providing a first amount of current from a source line to a bit line through the memory cell transistor when the memory cell transistor is activated; and a third control circuit for providing a second amount of current from the bit line to the source line through the memory cell transistor. According to this aspect, current supply from the second control circuit and current supply from the third control circuit are alternately repeated, and, in response to a potential of the bit line which arises while the third control circuit is providing current, a potential which is provided to the word line from the first control circuit is de-escalated.

In a fourth aspect, the present invention comprises a plurality of memory cell transistors, each having a floating gate insulated from other portion and a control gate at least one part of which overlaps with the floating gate, for varying an ON-state resistance value according to an amount of electric charge accumulated at the floating gate; a plurality of word lines to be connected to the respective control gates of the plurality of memory cell transistors; a source line to be commonly connected to the sources of the plurality of memory cell transistors; a bit line to be commonly connected to drains of the plurality of memory cell transistors; a first control circuit for selectively activating one of the plurality of memory cell transistors by applying a prescribed potential to one of the plurality of word lines based on row selection information; and a second control circuit for providing a first amount of current, at the time of activation of one of the plurality of memory cell transistors, from the source line to the bit line through the memory cell transistor activated. In this aspect, the first control circuit de-escalates a potential to be provided to the plurality of word lines with the progress of writing data into the memory cell transistor activated.

Efficiency of writing to the memory cell transistor is lowered in a range of normal operation with the rise of a potential of the control gate. Therefore, writing efficiency is set to be low in the beginning of writing operation during which a potential of the word lines is high, and set to be high in the latter half of writing operation during which a potential of the word lines becomes low. On the other hand, if the potential of the control gate is constant, the writing efficiency will be lowered each time a writing operation is repeated. Thus, the efficiency of writing into the memory cell transistor is kept almost equal from the beginning until just before the amount of electrical charge to be written reaches the maximum.

DESCRIPTION OF THE PREFERRED EMBODIMENTS

Figure 7:
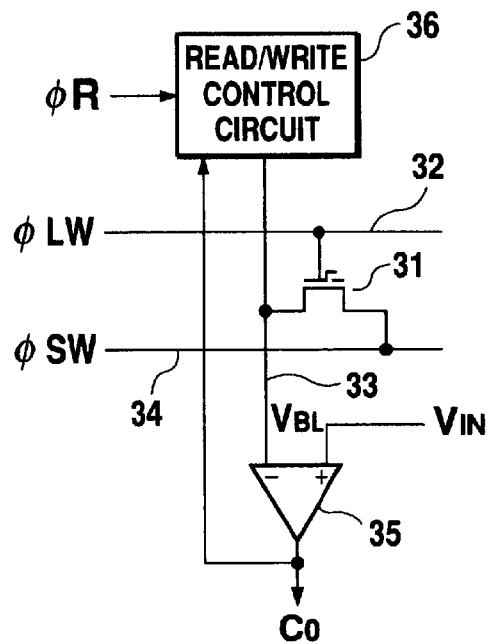
FIG. 7 is a circuit diagram showing a first embodiment of the non-volatile semiconductor memory device according to the present invention.
Figure 8:
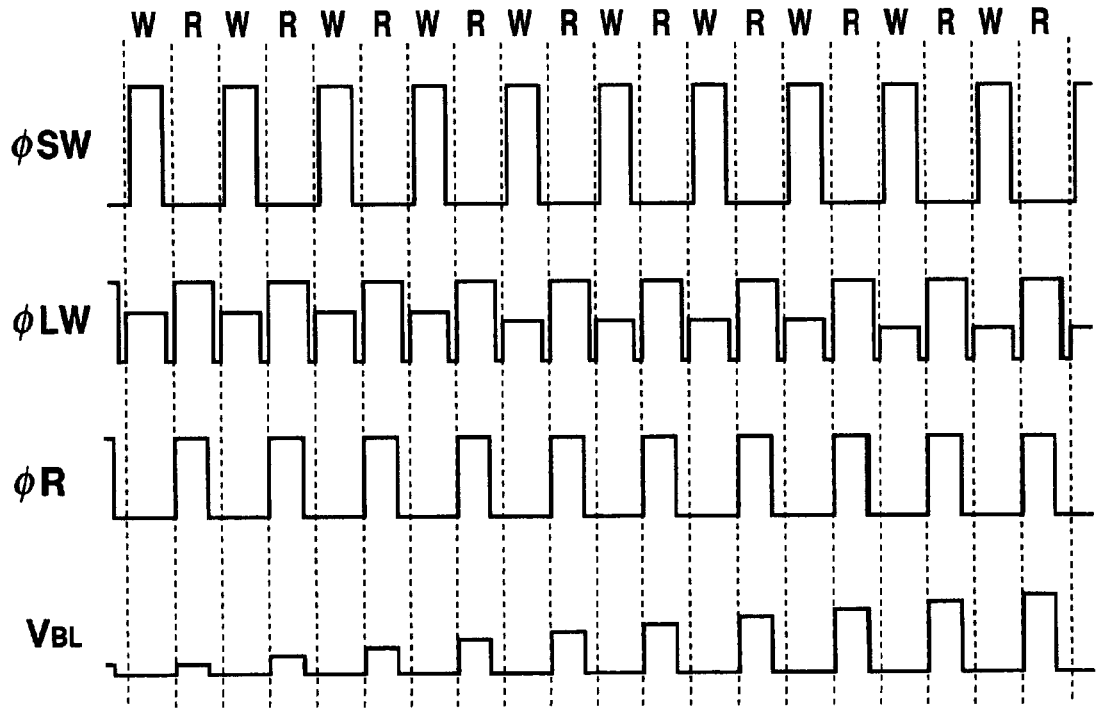
FIG. 8 is a timing chart showing the operation of the non-volatile semiconductor memory device of the first embodiment according to the present invention.

FIG. 7 is a circuit diagram showing a first embodiment of the non-volatile semiconductor memory device according to the present invention, while FIG. 8 is a timing chart showing its operation.

Figure 1:
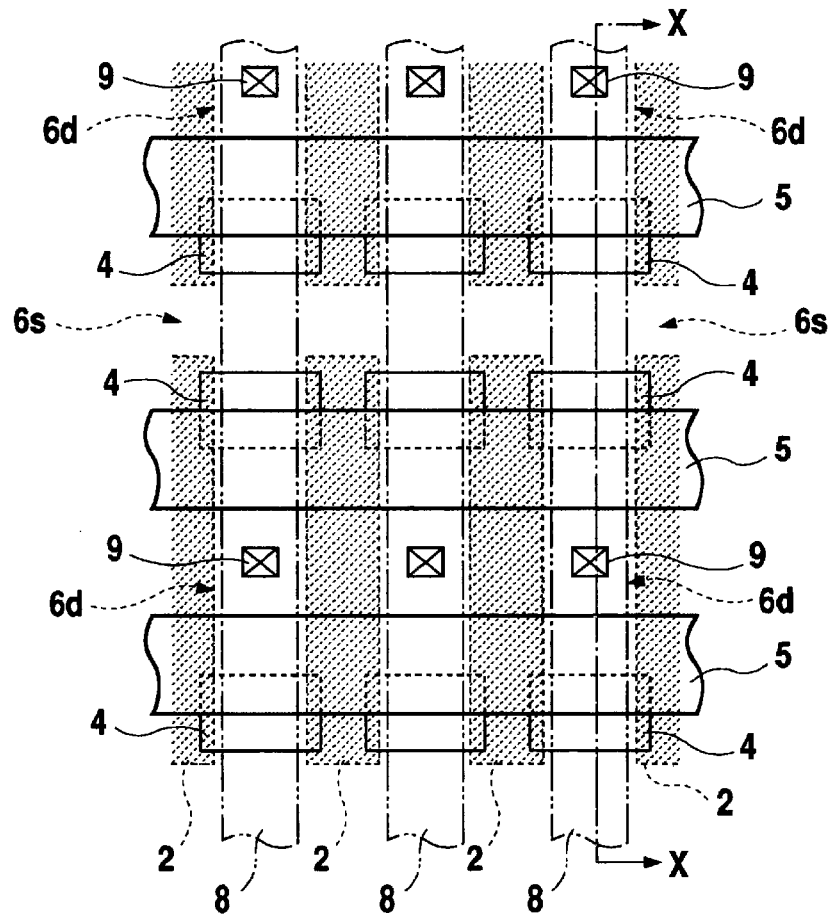
FIG. 1 is a top view showing the constitution of memory cell of a conventional non-volatile semiconductor memory device.
Figure 2:
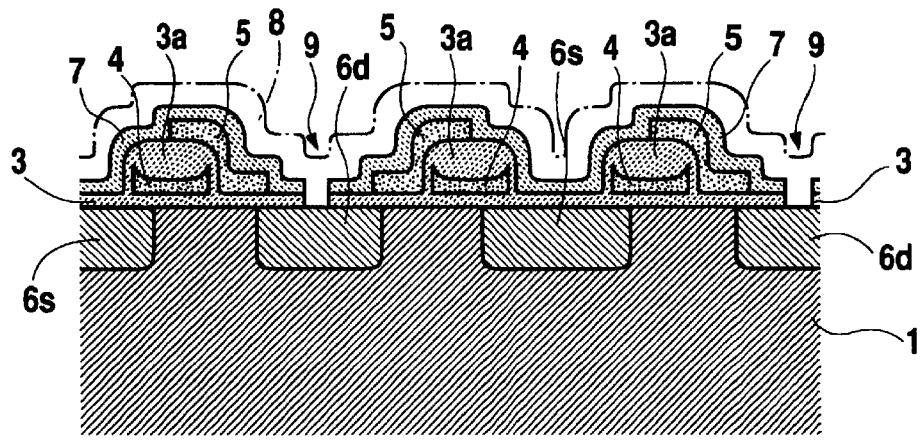
FIG. 2 is a sectional view of the X—X line shown in FIG. 1.
Figure 3:
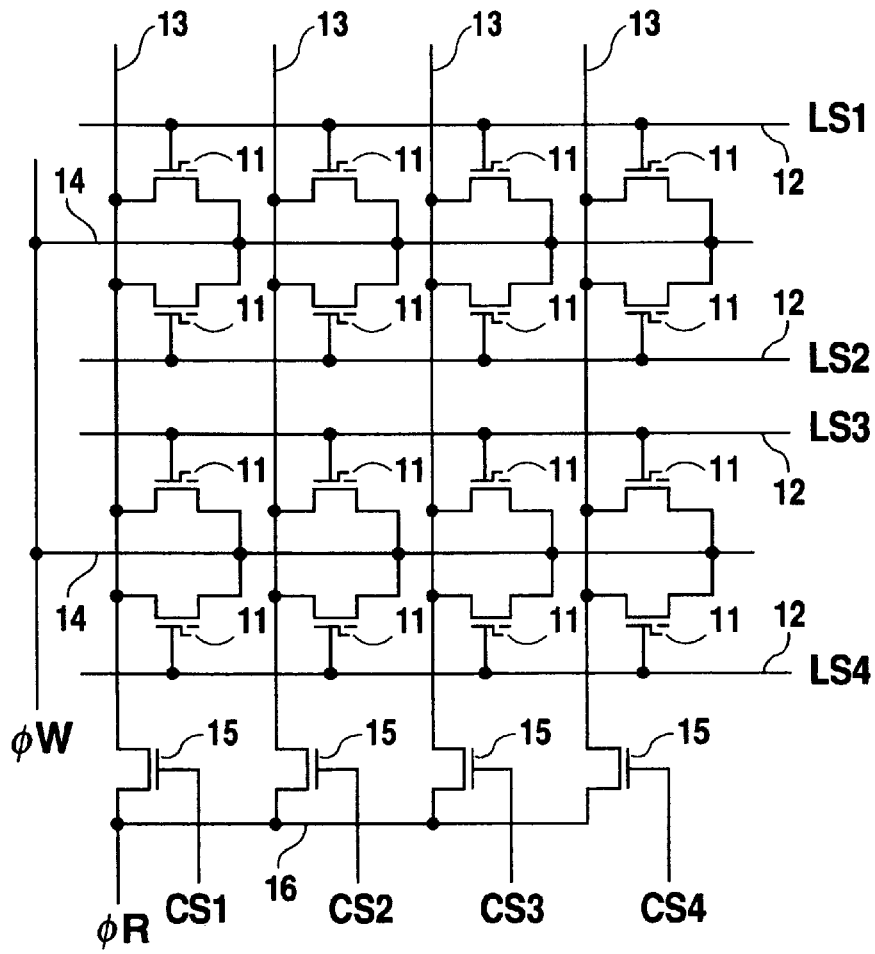
FIG. 3 is a circuit diagram showing the constitution of a conventional non-volatile semiconductor memory device.
Figure 4:
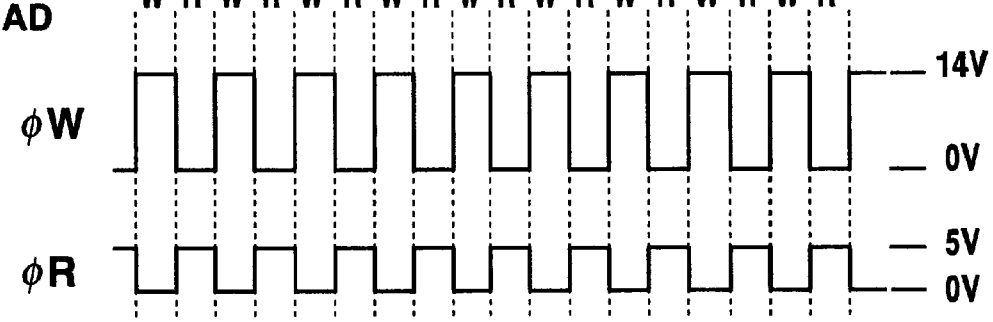
FIG. 4 is a wave form chart of a write clock and a read clock.
Figure 5:
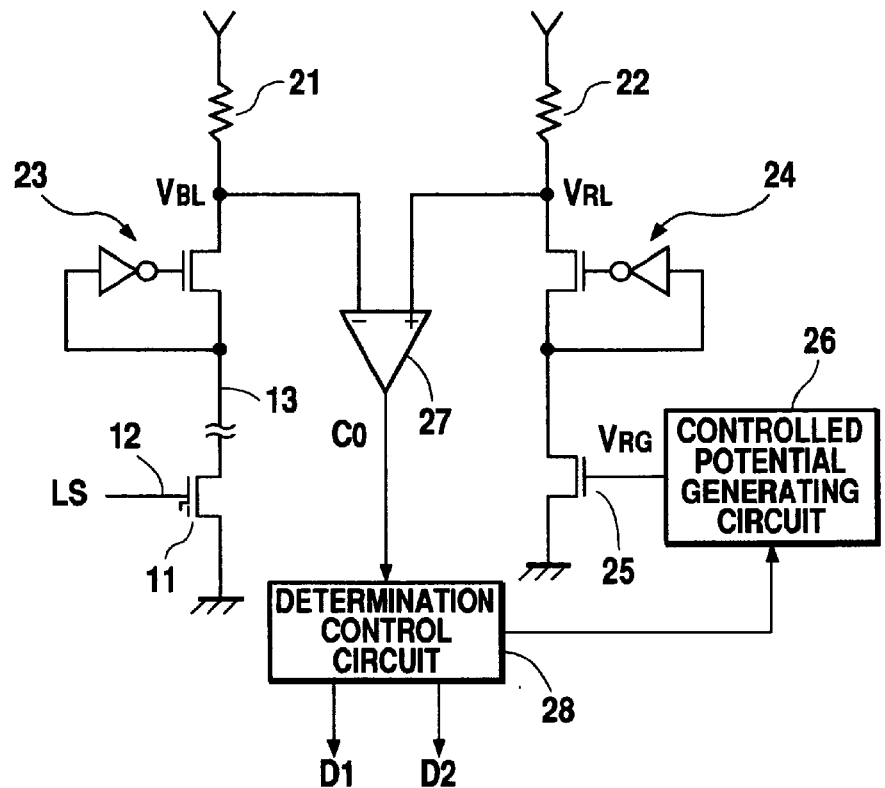
FIG. 5 is a circuit diagram showing the constitution of a sense amplifier.
Figure 6:
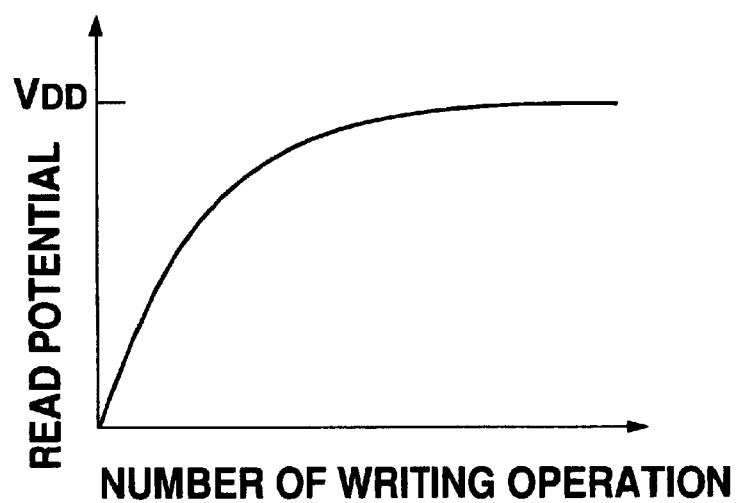
FIG. 6 is an explanatory drawing of a state of writing performed by a conventional non-volatile semiconductor memory device.

A memory cell transistor 31 has the same structure as that of memory cell transistors 11 shown in FIG. 3. Thus, it has a floating gate and a control gate, and varies an ON-state resistance value in proportion to an amount of electric charges injected into (accumulated at) the floating gate. A word line 32 is connected to the control gate of the memory cell transistor 31, and a row selection clock φLW, which rises in response to row address information, is applied to the word line 32. A bit line 33 is arranged in a direction which the bit line intersects the word line 32. The bit line 33 is connected to a drain of the memory cell transistor 31, and a comparator 35, which will be described later, is connected to the bit line 33. A source line 34 is arranged in parallel with the word line 32, and connected to a source of the memory cell transistor 31. A write clock φSW is applied to the source line 34. Thus, the memory cell transistor 31 is activated in response to a potential of the word line 32, and receives prescribed potentials provided from the bit line 32 and the source line 33 whenever any writing, reading, or erasing operation is carried out.

The comparator 35 is connected to the bit line 33, and compares a potential VBL of the bit line 33 with a signal potential VIN which is corresponding to multiple-valued information to be stored, and then outputs a comparison output CO. A read/write control circuit 36 is connected to the bit line 33, and provides a power supply potential or an earth potential to the bit line 33 in response to a read clock φR. More specifically, in a reading operation, by applying the power supply potential to the bit line 33, current flows to the source line 34 through the memory cell transistor 31 and an ON-state resistance value of the memory cell transistor 31 is read out as fluctuation of the bit line potential VBL. Further, in a writing operation, by lowering a potential of the bit line 33 up to the earth potential, write current flows into the memory cell transistor 31 when the write clock φSW is applied to the source line 34. Further, the read/write control circuit 36 is constituted so that the writing operation is terminated when a comparison output CO of the comparator 35 is reversed or, in other words, when the bit line potential VBL reaches the signal potential VIN in reading operation. The writing operation can be terminated if write current which flows into the memory cell transistor 31 is below a threshold value. Thus, termination is feasible by any one of the termination of supply of the write clock φSW, raise of the bit line potential VBL, and cancellation of selection of the word line 32.

The write clock φSW alternately repeats the earth potential (for example, 0V) and power supply potential for writing (for example, 14V) at regular intervals. On the other hand, the read clock φR alternately repeats the earth potential and the power supply potential for reading (for example, 5V) at the same intervals as that of the write clock φSW. The phases of the write clock φSW and the read clock φR differ by half a cycle. While the write clock φSW shows the power supply potential, the read clock φR shows the earth potential and, while the read clock φR shows the power supply potential, the write clock φSW shows the earth potential. Thus, a rise of the write clock φSW leads to setting of a writing period W, whereas a rise of the read clock φR leads to setting of a reading period R. In order to prevent the power supply potential being simultaneously applied to both of the bit line 33 and the source line 34 due to an operational delay of circuits, periods which the write clock φSW and the read clock OR show the earth potential are set.

During the reading period R the row selection clock φLW has a fixed value (for example, 5V) to turn on the control gate of the memory cell transistor 31, whereas during the writing period W it has a variation (for example, 2 to 4 V) within a range which efficiency of writing into the memory cell transistor 31 can be controlled. The potential of the row selection clock φLW during the writing period W is set to be highest in the beginning of writing operation and becomes low whenever writing operation is repeated. In this embodiment, as shown in FIG. 8, it is the potential de-escalated every time the writing operation is repeated four times. Further, the potential of the row selection clock φLW is once lowered up to the earth potential for the purpose of temporarily putting the memory cell transistor 31 in a state of non-selection at the time of switching from the writing period W to the reading period R, or the reverse.

The bit line potential VBL synchronizes with the read clock φR. The bit line potential VBL becomes the earth potential while the read clock φR is lowered, and becomes a potential to be determined according to an ON-state resistance value of the memory cell transistor 31 when the read clock φR is raised. When writing into the memory cell transistor 31 is repeated due to supply of the write clock φSW, the ON-state resistance value of the memory cell transistor 31 increases, whereby the bit line potential VBL at the time of reading rises in stages. Thus, by terminating the writing operation when the bit line potential VBL exceeds a desired signal potential VIN, it is possible to let the bit line potential VBL at the time of reading coincide with the signal potential VIN.

Figure 9:
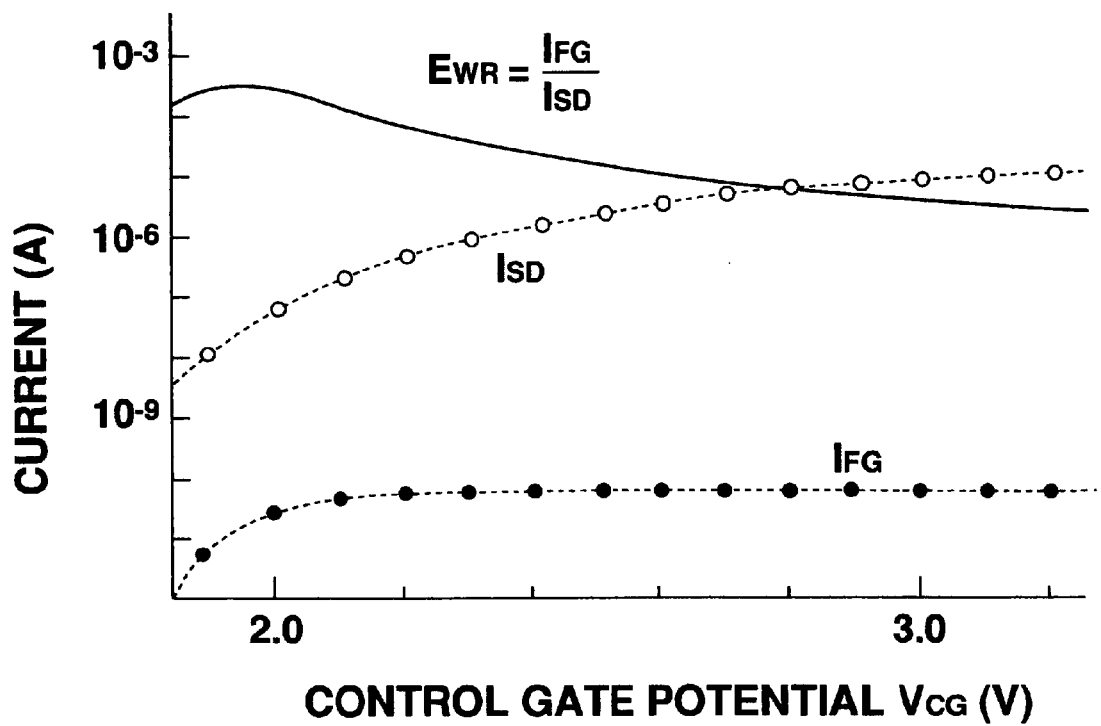
FIG. 9 shows actual values of characteristics of writing into memory cell transistors according to the present invention.

FIG. 9 shows a relationship between a potential to be applied to the control gate of the memory cell transistor 31 and efficiency of writing into the memory cell transistor 31. In this drawing, a reference symbol ISD represents current which flows from a source to a drain of the memory cell transistor 31 in writing, and a reference symbol IFG represents current which flows from a floating gate to the drain at this time. Values shown in this drawing are actual values when the source of the memory cell transistor 31 is 11V, the drain is 0.8V, and the floating gate is 9.5V. An electrode for fixation of potential and detection of current is connected to the floating gate.

When a potential VCG of the control gate is changed within a range of 1.9 to 3.2V, current ISD increases from approximately 10E–8A ("E" being E th power) to approximately 10E–5A. On the other hand, when the potential VCG of the control gate is up to approximately 2.1V, current IFG increases from approximately 10E–11A to approximately 10E–10A. However, when the potential VCG exceeds approximately 2.2V, the current IFG becomes almost stable at approximately 10E–10A . Since the current IFG corresponds to the number of hot electrons to be injected into the floating gate per unit time, the current IFG represents an amount of electric charge to be written into the memory cell transistor 31. Therefore, efficiency of writing EWR into the memory cell transistor 31 is represented by a ratio of each current IFG/ISD, and the potential VCG lowers within a range of 2.0 to 3.2V with the rise of the potential VCG.

Figure 10:
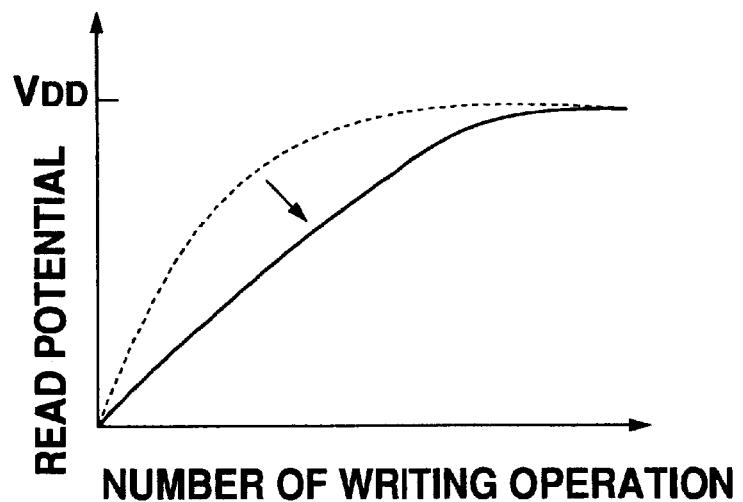
FIG. 10 is an explanatory drawing of a state of writing performed by the non-volatile semiconductor memory device according to the present invention.

Normal operation in writing into the memory cell transistor 31 is controlled so that the current ISD which flows from the source to the drain is constant. Therefore, if writing efficiency EWR to a change of the potential VCG of the control gate has characteristics as shown in FIG. 9, the current IFG from the floating gate will decrease with the rise of the potential VCG. On the other hand, if the potential VCG of the control gate is constant, a potential of the floating gate of the memory cell transistor 31 will lower in proportion to the amount of electric charge injected. Thus, if an amount of writing increases, it will be difficult for hot electrons on the drain to be accelerated, thereby lowering the writing efficiency. In such circumstances, the potential VCG of the control gate is set to be high in the beginning of writing operation when the writing efficiency is high, and with the decrease of the writing efficiency resulting from repetition of writing, the potential VCG of the floating gate is lowered. Thus, a lowering of the writing efficiency resulting from a lowering of the potential of the floating gate is compensated for by a rise of the writing efficiency resulting from a lowering of the potential of the control gate, whereby an almost even writing efficiency is maintained. Consequently, the potential VBL of the bit line 33 at the time of reading which is repeated alternately with writing changes, as shown in FIG. 10, from the earth potential to the power supply potential in an almost constant rate with the repetition of writing operation. As compared with a case shown by a broken line in which the potential VCG of the control gate is maintained even, when the number of writing operations is small, a rate of change of the bit line potential VBL is low. On the other hand, when the number of writing operations is great, the rate of change of the bit line potential VBL is high.

Figure 11:
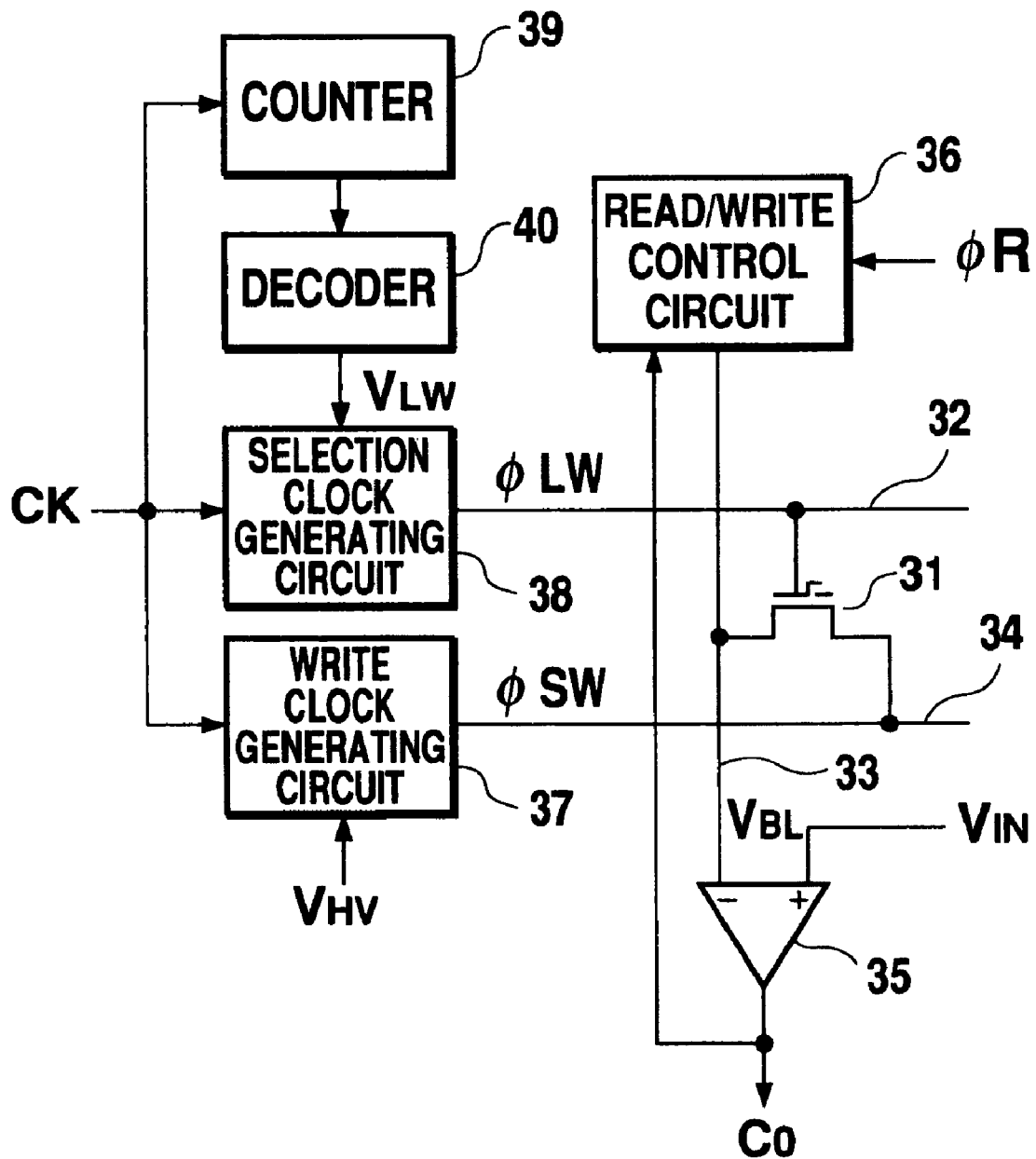
FIG. 11 is a circuit diagram showing a second embodiment of the non-volatile semiconductor memory device according to the present invention.
Figure 12:
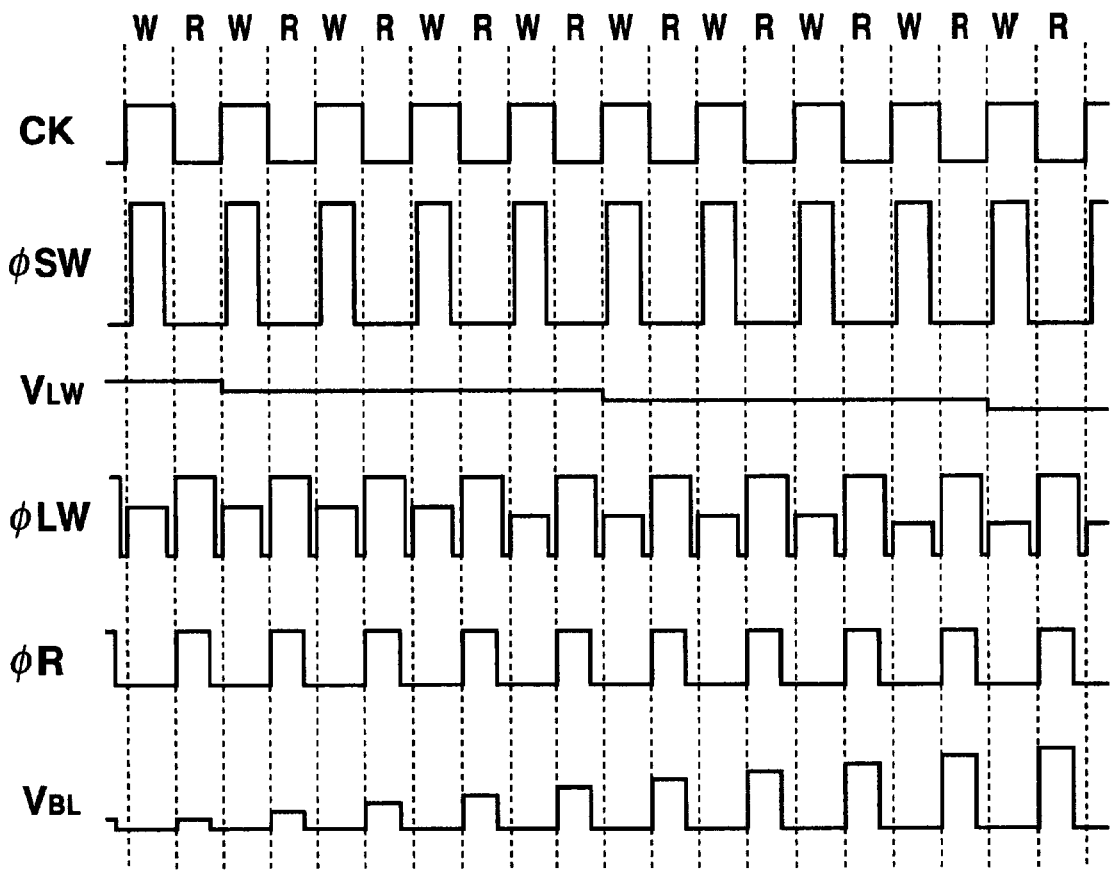
FIG. 12 is a timing chart showing the operation of the non-volatile semiconductor memory device of the second embodiment according to the present invention.

FIG. 11 is a circuit diagram showing a second embodiment of the non-volatile semiconductor memory device according to the present invention, and FIG. 12 is a timing chart showing the operation. In FIGS. 11 and 12, identical reference numerals and symbols are attached to the particular elements and circuits which are already shown in FIG. 7.

In the embodiment shown in FIG. 11, a write clock generating circuit 37 is connected with a source line 34. The write clock generating circuit 37 generates the write clock φSW in response to a reference clock CK having a regular cycle. The write clock generating circuit 37 further sets a crest value of the write clock φSW according to a high potential VHV for writing which is provided from a step-up circuit (not shown in drawings). A selection clock generating circuit 38 is connected to the word line 32, and generates the row selection clock φLW in response to the reference clock CK having a regular cycle. The selection clock generating circuit 38 sets, in the writing operation, a crest value of the row selection clock φLW according to a potential VLW provided from a decoder 40 which will be described later. In the reading operation, a crest value of the row selection clock φLW is set to a certain value regardless of a potential VLW.

A counter 39 may be, for example, a binary counter, and generates a count value which changes in the same cycle as that of the reference clock CK by counting the reference clock CK. The decoder 40 connected to the counter 39 decodes a count value of the counter 39, and generates a potential VLW which is de-escalated. For example, constitution of the decoder 40 is such that a potential is selected among from a plurality of potentials, which change by a certain step width, according to a count value of the counter 39, whereby the potential selected is lowered step by step every time the count value of the counter 39 is incremented by four. Therefore, a crest value of the row selection clock φLW is de-escalated whenever the reference clock CK is counted, in other words, every time writing into the memory cell transistor 31 is repeated.

The write clock φSW alternately repeats the earth potential (for example, 0V) and the power supply potential for writing (for example, 14V) in a cycle according to the reference clock CK. The read clock φR alternately repeats the earth potential and the power supply potential for reading (for example, 5V) in the same cycle as that of the write clock φSW. There is a phase difference by a half cycle between the write clock φSW and the read clock φR. During a period that the write clock φSW shows the power supply potential, the read clock φR shows the earth potential, whereas, during a period that the read clock φR shows the power supply potential, the write clock φSW shows the earth potential. Thus, a rise of the write clock φSW leads to setting of a writing period W, whereas a rise of the read clock φR leads to setting of a reading period R. In order to prevent that the power supply potential being simultaneously applied to both of the bit line 33 and the source line 34 due to an operational delay, periods which the write clock φSW and the read clock φR show the earth potential are set.

During the reading period R the row selection clock φLW has a fixed value (for example, 5V) to turn on the control gate of the memory cell transistor 31, whereas during the writing period W it has a variation (for example, 2 to 4 V) within a range which efficiency of writing into the memory cell transistor 31 can be controlled. A potential of the row selection clock φLW during the writing period W is set to be highest in the beginning of writing operation and becomes lower whenever writing operation is repeated. In this embodiment, as shown in FIG. 12, it is set that a potential is de-escalated every time the writing operation is repeated four times. Further, the potential of the row selection clock φLW is once lowered up to the earth potential for the purpose of temporarily putting the memory cell transistor 31 in a state of non-selection at the time of switching from the writing period W to the reading period R, and vice versa.

The bit line potential VBL synchronizes with the read clock φR. The bit line potential VBL becomes the earth potential while the read clock φR is lowered, and becomes a potential to be determined according to an ON-state resistance value of the memory cell transistor 31 while the read clock φR is raised. When writing into the memory cell transistor 31 is repeated due to supply of the write clock φSW, the ON-state resistance value of the memory cell transistor 31 increases, whereby the bit line potential VBL at the time of reading is escalated. Thus, by terminating the writing operation when the bit line potential VBL exceeds a desired signal potential VIN, it is possible to let the bit line potential VBL at the time of reading coincide with the signal potential VIN.

Figure 13:
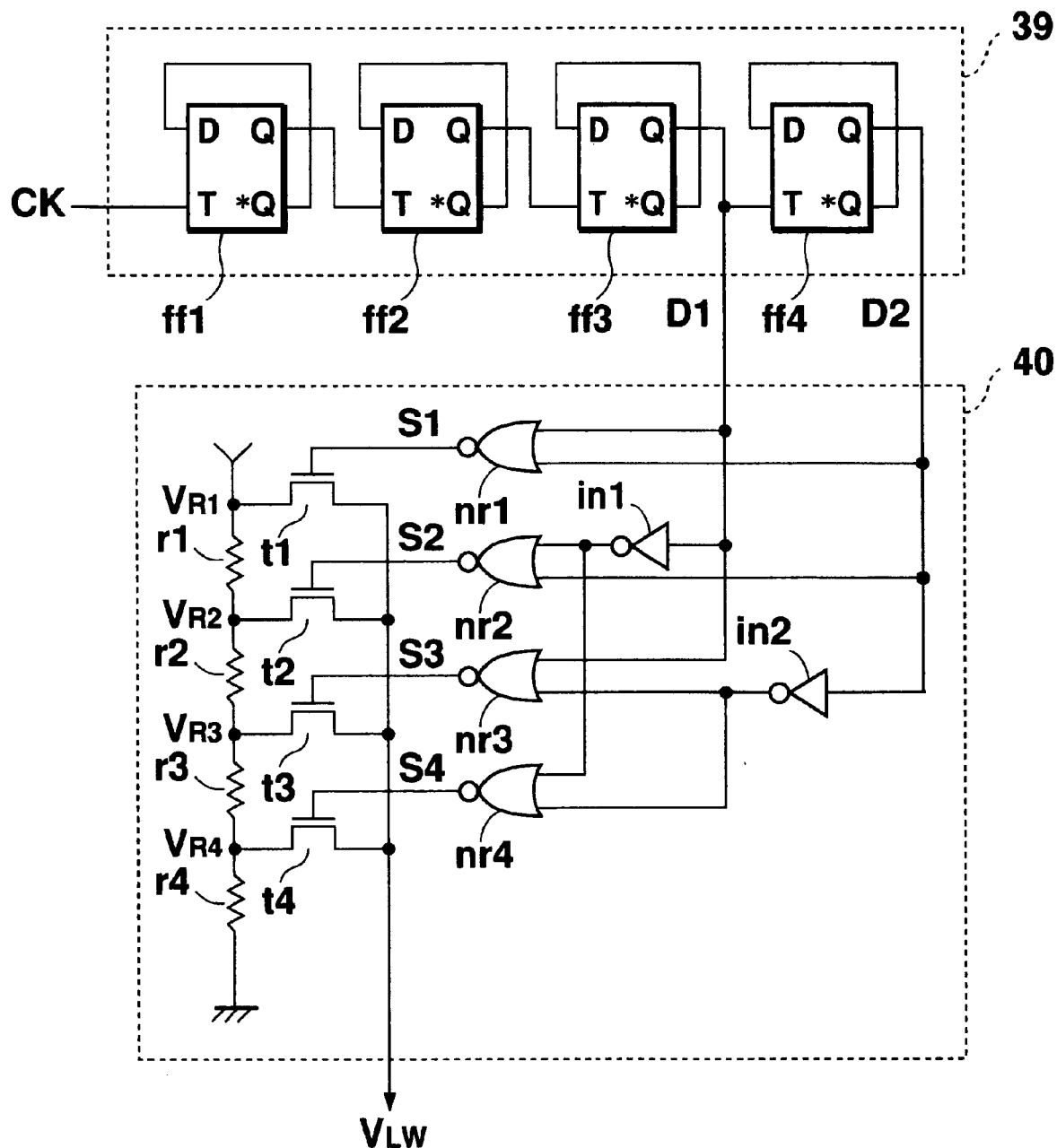
FIG. 13 is a circuit diagram showing the constitution of main parts of the non-volatile semiconductor memory device shown in FIG. 11 according to the present invention.

FIG. 13 is a circuit diagram showing an example constitution of the counter 39 and decoder 40 to set a crest value of the write clock φSW. This drawing shows a case that the counter is set to be four bits and a potential VLW is lowered whenever the count value is incremented by four.

The counter 39 is composed of four flip flops ff1 to ff4. An inversion output *Q of each of the flip flops ff1 to ff4 is fed back to a data input D, and an output Q of the respective preceding flip flops ff1 to ff3 is connected to a timing input T of the respective succeeding flip flops ff2 to ff4 from which the flip flop of first stage ff1 is excluded. The reference clock CK is inputted to a timing input T of the flip flop of first stage ff1. outputs Qs of the flip flops of third and fourth stages ff3 and ff4 are outputted as count values of two bits D1 and D2, respectively. These count values D1 and D2, which are outputted removing inferior two bits from the four-bit-binary counter, change the values in a cycle which is four times as much as that of the reference clock CK, in other words, every time the counter 39 counts the reference clock CK four times.

The decoder 40 is composed of resistances r1 to r4, switching transistors t1 to t4, NOR gates nr1 to nr4, and inverters in1 and in2. The resistances r1 to r4 are connected in series between a power supply and an earth, and generate four kinds of potentials VR1 to VR4 by the resistance division of power supply potential. Switching transistors t1 to t4 are connected, respectively, between each contact point and output of the resistances r1 to r4 from which four kinds of potentials VR1 to VR4 are outputted. When any one of the switching transistors t1 to t4 is turned on, one of the potentials VR1 to VR4 is output as a potential VLW. The NOR gates nr1 to nr4 and the inverters in1 and in2 are connected in such a manner that four-bit selection signals S1 to S4 any one of which becomes high level according to two-bit count values D1 and D2 of the counter 39 are generated. More specifically, a constitution such that when count values D1 and D2 are "0,0", only the selection signal S1 is high level is set, and the selection signals S2 to S4 become high level in turn every time the count values D1 and D2 are incremented one by one. Thus, when the count values D1 and D2 are "0,0", the highest potential Vr1 is outputted as a potential VLW, and every time the count values D1 and D2 are incremented by one, the potential outputted as a potential VLW is lowered step by step.

The potentials VLW obtained in the manner described above are lowered in four stages from the potential VR1 to the potential VR4 every time the reference clock CK is counted by four-clock portions. Thus, with regard to the write clock φSW to be generated in response to the potentials VLW, its crest value is lowered in every four cycles. When the count values D1 and D2 become "1,1", in other words, when the reference clock CK is counted by 15-clock portions, the counter 39 stops counting and fixes the count values D1 and D2. Thus, the crest value of the write clock φSW will not be lowered less than minimum potential Vr4.

Figure 14:
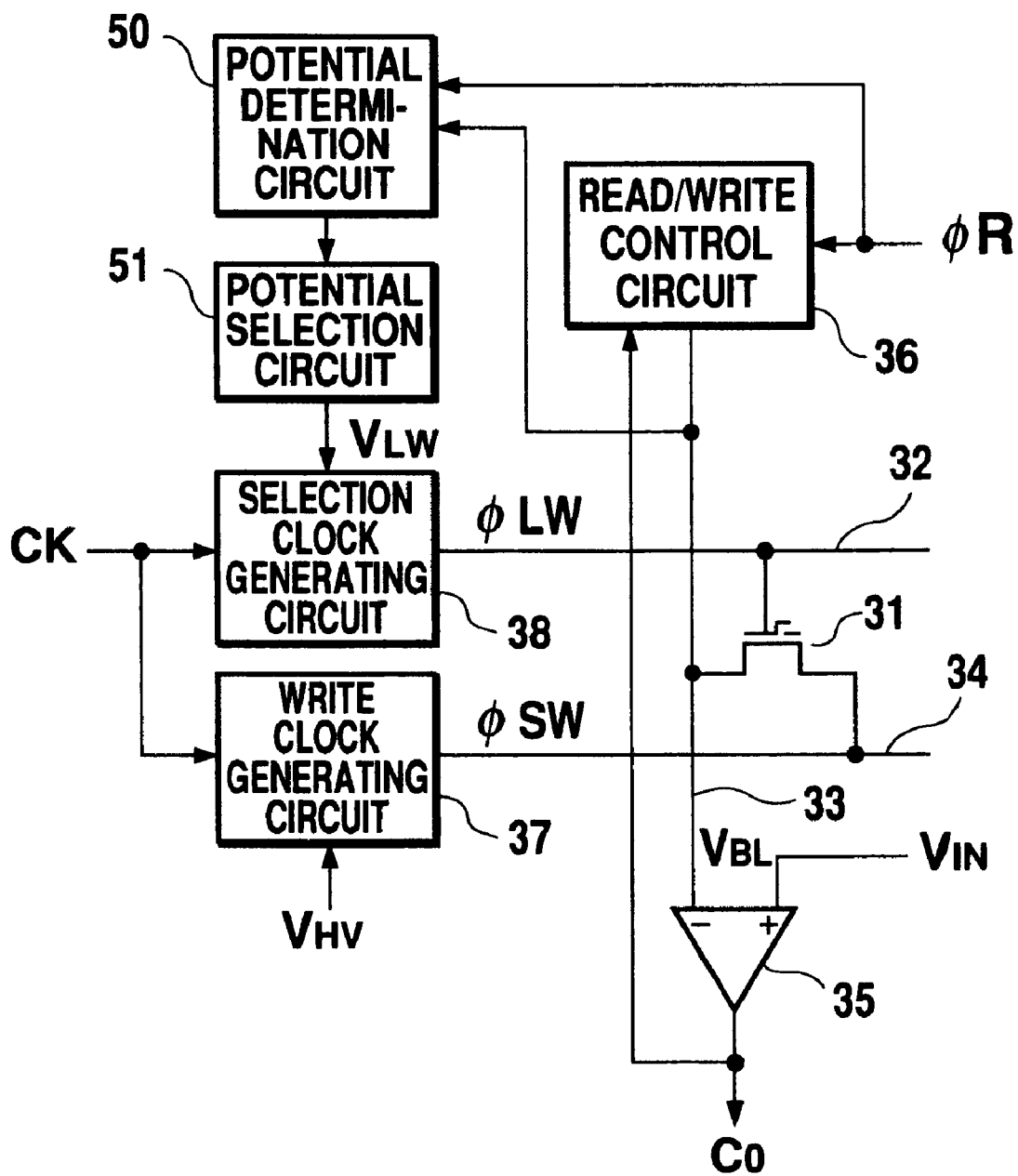
FIG. 14 is a circuit diagram showing a third embodiment of the non-volatile semiconductor memory device according to the present invention.
Figure 15:
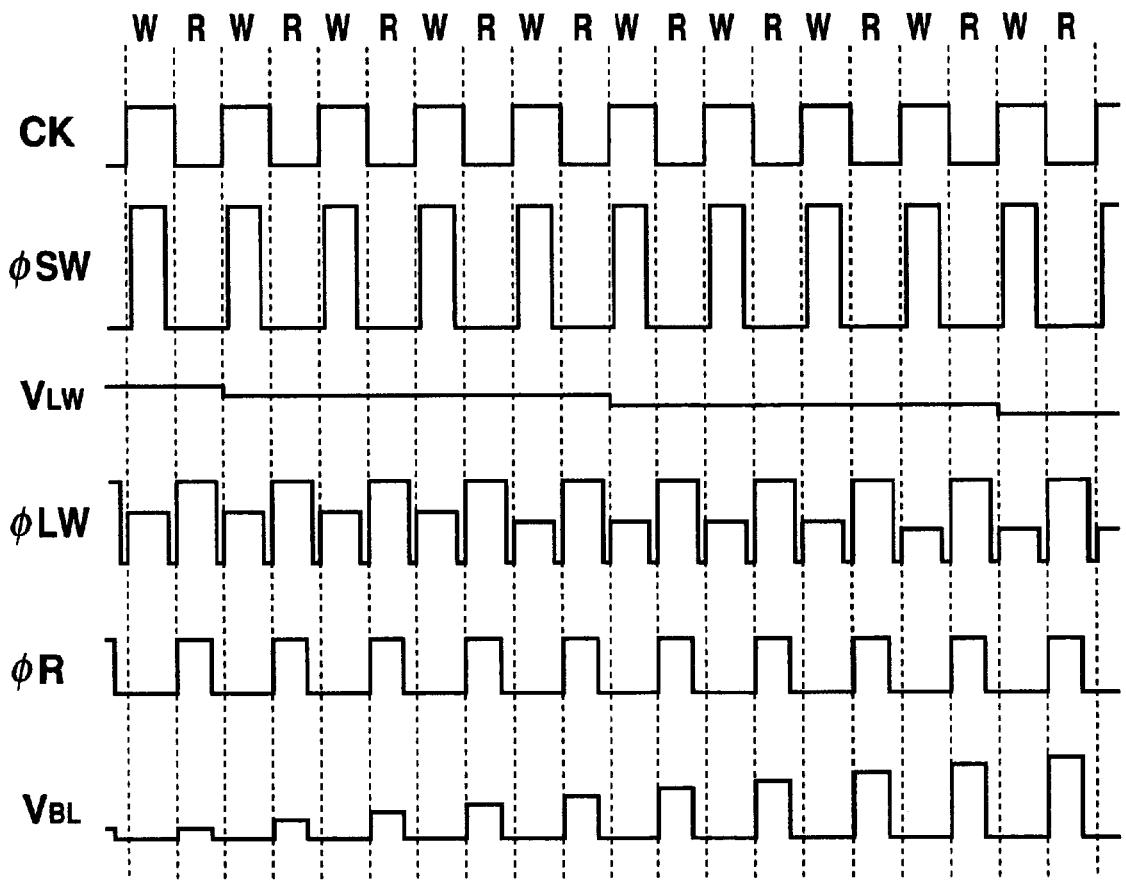
FIG. 15 is a timing chart showing the operation of the non-volatile semiconductor memory device of the third embodiment according to the present invention.

FIG. 14 is a circuit diagram showing a third embodiment of the non-volatile semiconductor memory device according to the present invention, and FIG. 15 is a timing chart showing the operation. In FIG. 14, identical reference numerals and symbols are attached to the particular elements and circuits which are already shown in FIG. 7.

A potential determination circuit 50 takes in a potential VBL of the bit line 33 in response to the read clock φR and determines the potential VBL in multiple stages. More specifically, since the potential VBL of the bit line 33 in reading rises as ON-state resistance value of the memory cell transistor 31 becomes high with the progress of writing, a state of progress of writing into the memory cell transistor 31 is determined based on a degree of rise of the potential VBL. A potential selection circuit 51 responds to the result of determination by the potential determination circuit 50, and lowers a potential for determination in stages every time the potential VBL of the bit line 33 at the time of reading rises, thereby providing the potential VBL indirectly to the selection clock generating circuit 38 as a potential VLW. For example, constitution is such that a potential is selected among from a plurality of potentials, which change by a certain step width, according to the result of determination by the potential determination circuit 50, whereby the potential selected is de-escalated every time the potential VBL of the bit line 33 rises by a prescribed width. Therefore, a crest value of the row selection clock φLW is de-escalated whenever the potential VBL of the bit line 33 at the time of reading lowers due to the repetition of writing into the memory cell transistor 31.

The write clock φSW alternately repeats the earth potential (for example, 0V) and the power supply potential for writing (for example, 14V) in a cycle according to the reference clock CK. The read clock φR alternately repeats the earth potential and the power supply potential for reading (for example, 5V) in the same cycle as that of the write clock φSW. There is a phase difference by a half cycle between the write clock φSW and the read clock φR. During a period that the write clock φSW shows the power supply potential, the read clock φR shows the earth potential, whereas during a period that the read clock φR shows the power supply potential, the write clock φSW shows the earth potential. Thus, a rise of the write clock φSW leads to setting of a writing period W, whereas a rise of the read clock φR leads to setting of a reading period R. In order to prevent that due to an operational delay of circuits the power supply potential is simultaneously applied to both of the bit line 33 and the source line 34, periods which the write clock φSW and the read clock φR show the earth potential, respectively, are set.

During the reading period R, the row selection clock φLW has a fixed value (for example, 5V) to turn on the control gate of the memory cell transistor 31, whereas during the writing period W the value varies (for example, 2 to 4 V) within a range which efficiency of writing into the memory cell transistor 31 can be controlled. It is set that a crest value of the row selection clock φLW during the writing period W is highest in the beginning of writing operation and becomes lower in stages whenever the potential VBL of the bit line 33 lowers at the time of reading due to the repetition of writing. Further, the potential of the row selection clock φLW is once lowered up to the earth potential for the purpose of temporarily putting the memory cell transistor 31 in a state of non-selection at the time of switching from the writing period W to the reading period R, and vice versa.

The bit line potential VBL synchronizes with the read clock φR. The bit line potential VBL becomes the earth potential while the read clock φR is lowered, and becomes a potential to be determined according to an ON-state resistance value of the memory cell transistor 31 while the read clock φR is raised. When writing into the memory cell transistor 31 is repeated due to supply of the write clock φSW, the ON-state resistance value of the memory cell transistor 31 increases, whereby the bit line potential VBL rises in stages at the time of reading. Thus, by terminating writing operation when the bit line potential VBL exceeds a desired signal potential VIN, it is possible to let the bit line potential VBL at the time of reading coincide with the signal potential VIN.

Figure 16:
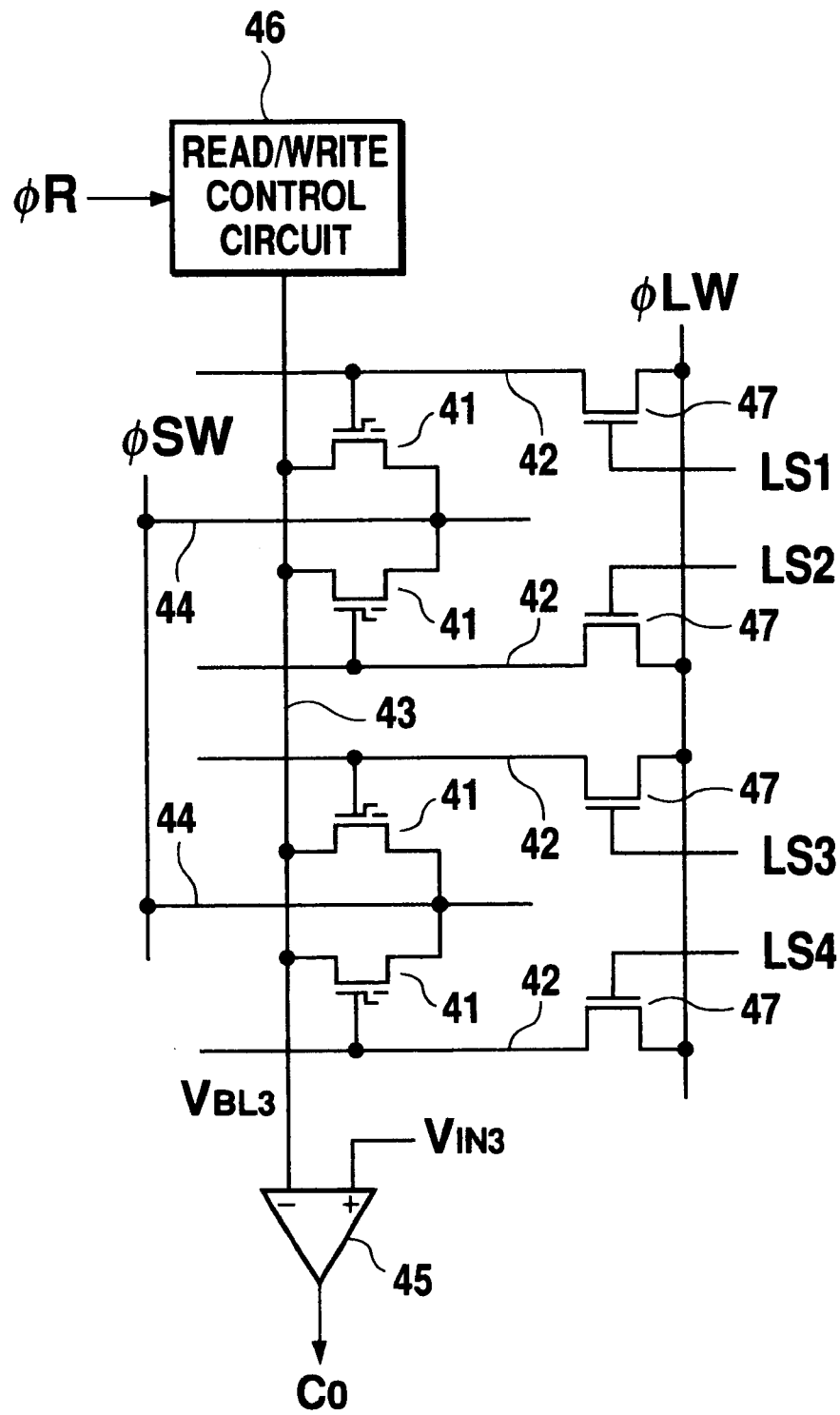
FIG. 16 is a circuit diagram showing a fourth embodiment of a non-volatile semiconductor memory device according to the present invention.

FIG. 16 is a circuit diagram showing a fourth embodiment of the non-volatile semiconductor memory device according to the present invention. This drawing exemplifies a case in which memory cell transistors 41 are arranged in four rows of one.

The plurality of memory cell transistors 41 arranged in the same column constitute a memory cell column. Each of the memory cell transistors 41 is same as the memory cell transistor 31 shown in FIG. 7. A plurality of word lines 42 are connected to the control gate of each of the memory cell transistors 41, respectively, and the row selection clock φLW which rises in response to row selection signals LS1 to LS4 is applied thereto. A bit line 43 is arranged parallel with the arrangement of the memory cell transistors (the memory cell column), and connected to all drains of the memory cell transistors 41. Source lines 44 are arranged, respectively, between the memory cell transistors 41 in parallel with the word lines, and connected to each source of the memory cell transistors 41, respectively. These source lines are connected in common, and the write clock φSW is applied thereto. Thus, each of the memory cell transistors 41 is activated in response to the row selection signals LS1 to LS4 which will be described later, and receives prescribed potentials from the bit line 43 and source lines 44 at every operation of writing, reading, and erasing.

A comparator 45 and a read/write control circuit 46 are connected to the bit line 43, respectively. The comparator 45 is identical to the comparator 35 shown in FIG. 7, and compares a potential VBL of the bit line 43 with a signal potential VIN3 corresponding to memory information. The read/write control circuit 46 is also identical to the read/write control circuit 36 shown in FIG. 7, and provides the power supply potential or the earth potential to the bit line 43 in response to the read clock The row selection transistors 47 are connected to each of the word lines 42, respectively, and are selectively turned on in response to the row selection signals LS1 to LS4, whereby the row selection clock φLW is provided to one of the word lines 42. The row selection clock φLW, the write clock φSW, and read clock φR are identical to those in FIG. 8. Operation after the row selection transistors 47 are selectively turned on in a specified row is same as that of FIG. 7.

In the fourth embodiment described above, a case that the memory cell transistors 41 are arranged in a column is exemplified. However, it may also be preferable that the memory cell transistors 41 are arranged in a plurality of columns as well as the bit line 43. In this case, with regard to the arrangement of the word lines 42 and the source lines 44, the same row is connected in common in each column, and the memory cell transistors 41 in the same row can be simultaneously selected in all the columns. Further, with regard to the arrangement of the comparator 45 and the read/write control circuit 46, it is preferable that they are independently provided in each column or a group of them provided is selectively connected to one of a plurality of columns.

In the devices described above, it is possible to maintain efficiency of writing into the memory cell transistor almost even in a wide range. Therefore, according to the present invention, characteristics of writing into the memory cell transistor can be maintained almost equal from the beginning of writing to the end of writing. Thus, a wide operational range can be set for the memory cell transistor. This enables an improvement in the resolution of the memory cell transistor. This is also effective in multiplicity of values of memory information.

What is claimed is:

1. A non-volatile semiconductor memory device comprising:

a memory cell transistor, having a floating gate insulated from other portion and a control gate at least one part of which overlaps with the floating gate, for varying an ON-state resistance value according to an amount of electric charge accumulated at the floating gate;

a word line to be connected to the control gate of said memory cell transistor;

a source line to be connected to a source of said memory cell transistor;

a bit line to be connected to a drain of said memory cell transistor;

a first control circuit for activating said memory cell transistor by applying a predetermined potential to said word line; and a second control circuit for providing a first amount of current from said source line to said bit line through said memory cell transistor when said memory cell transistor is activated, wherein said first control circuit de-escalates a potential to be provided to said word line with the progress of writing of data into said memory cell transistor.

2. The non-volatile semiconductor memory device according to claim 1, said device further comprising:

a third control circuit for providing a second amount of current from said bit line to said source line through said memory cell transistor, wherein current supply from said second control circuit and current supply from said third control circuit are alternately repeated, and current supply by said second control circuit is halted when a potential of said bit line which arises during current supply by said third control circuit reaches a desired potential.

3. A non-volatile semiconductor memory device comprising:

a memory cell transistor, having a floating gate insulated from other portion and a control gate at least one part of which overlaps with the floating gate, for varying an ON-state resistance value according to an amount of electric charges accumulated at the floating gate;

a word line to be connected to the control gate of said memory cell transistor;

a source line to be connected to a source of said memory cell transistor;

a bit line to be connected to a drain of said memory cell transistor;

a first control circuit for activating said memory cell transistor by periodically giving a predetermined potential to said word line in response to a clock having a certain cycle; and a second control circuit for providing a first amount of current from said source line to said bit line through said memory cell transistor when said memory cell transistor is activated, wherein said first control circuit has a counter for counting said clock and a decoder for generating a potential which varies according to a count value of said counter, and de-escalates a potential to be provided to said word line according to a count value of said counter.

4. The non-volatile semiconductor memory device according to claim 3, said device further comprising:

a third control circuit for providing a second amount of current from said bit line to said source line through said memory cell transistor, wherein current supply from said second control circuit and current supply from said third control circuit are alternately repeated, and current supply by said second control circuit and said third control circuit is halted when a potential of said bit line which arises during current supply by said third control circuit reaches a desired potential.

5. A non-volatile semiconductor memory device comprising:

a memory cell transistor, having a floating gate insulated from other portion and a control gate at least one part of which overlaps with the floating gate, for varying an ON-state resistance value according to an amount of electric charges accumulated at the floating gate;

a word line to be connected to the control gate of said memory cell transistor;

a source line to be connected to a source of said memory cell transistor;

a bit line to be connected to a drain of said memory cell transistor;

a first control circuit for activating said memory cell transistor by applying a prescribed potential to said word line;

a second control circuit for providing a first amount of current from said source line to said bit line through said memory cell transistor when said memory cell transistor is activated; and a third control circuit for providing a second amount of current from said bit line to said source line through said memory cell transistor, wherein current supply from said second control circuit and current supply from said third control circuit are alternately repeated, and a potential to be provided to from said first control circuit to said word line is de-escalated in response to a potential of said bit line which arises during current supply by said third control circuit.

6. The non-volatile semiconductor memory device according to claim 5, wherein current supply from said second control circuit and current supply from said third control circuit are alternately repeated, and current supply by said second control circuit and said third control circuit is halted when a potential of said bit line which arises during current supply by said third control circuit reaches a desired potential.

7. A non-volatile semiconductor memory device comprising:

a plurality of memory cell transistors having a floating gate insulated from other portion and a control gate at least one part of which overlaps with the floating gate, for varying an ON-state resistance value according to an amount of electric charges accumulated at the floating gate;

a plurality of word lines to be connected to the respective control gates of said plurality of memory cell transistors;

at least one source line to be commonly connected to sources of said plurality of memory cell transistors;

at least one bit line to be commonly connected to drains of said plurality of memory cell transistors;

a first control circuit for selectively activating one of said memory cell transistors by applying a prescribed potential to one of said plurality of word lines based on row selection information; and a second control circuit for providing a first amount of current at the time of activation of one of said plurality of memory cell transistors, from said source line to said bit line through said memory cell transistor activated, wherein said first control circuit de-escalates a potential to be provided to said plurality of word lines with the progress of writing of data into said memory cell transistor activated.

8. The non-volatile semiconductor memory device according to claim 7, said device further comprising:

a third control circuit for providing a second amount of current from said bit line to said source line through said memory cell transistor activated, wherein current supply by said second control circuit and current supply by said third control circuit are alternately repeated, and when a potential of said bit line which arises during current supply by said third control circuit reaches a desired potential, current supply by said second control circuit is halted.

* * * * *